United States Patent
Cha et al.

(10) Patent No.: US 9,123,871 B1
(45) Date of Patent: Sep. 1, 2015

(54) METHOD OF MANUFACTURING LIGHT EMITTING DIODE PACKAGE

(71) Applicant: SAMSUNG ELECTRONICS CO., LTD., Suwon-Si, Gyeonggi-do (KR)

(72) Inventors: Nam Goo Cha, Ansan-Si (KR); Yong Min Kwon, Seoul (KR); Kyoung Jun Kim, Yongin-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/516,548

(22) Filed: Oct. 16, 2014

(30) Foreign Application Priority Data

Feb. 21, 2014 (KR) ........................ 10-2014-0020167

(51) Int. Cl.
*H01L 33/48* (2010.01)
*H01L 33/62* (2010.01)

(52) U.S. Cl.
CPC .............. *H01L 33/486* (2013.01); *H01L 33/62* (2013.01); *H01L 2933/005* (2013.01); *H01L 2933/0033* (2013.01); *H01L 2933/0041* (2013.01); *H01L 2933/0066* (2013.01)

(58) Field of Classification Search
CPC ..... H01L 33/005; H01L 33/48; H01L 33/486; H01L 33/52; H01L 33/62; H01L 31/0203; H01L 31/12; H01L 31/18; H01L 2924/12041; H01L 2933/005; H01L 2933/0033; H01L 2933/0041; H01L 2933/0066
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| KR | 10-0865114 B1 | 10/2008 |
| KR | 10-1109321 B1 | 1/2012 |

(Continued)

*Primary Examiner* — Armando Rodriguez
(74) *Attorney, Agent, or Firm* — McDermott Will & Emery LLP

(57) ABSTRACT

A method of manufacturing a light emitting diode (LED) package may include forming a light emitting structure having a first conductivity-type semiconductor layer, an active layer and a second conductivity-type semiconductor layer on a growth substrate, forming first and second electrodes connected to the first and second conductivity-type semiconductor layers, respectively, bonding a first surface of a light transmissive substrate opposite to a second surface thereof to the light emitting structure, identifying positions of the first and second electrodes that are seen through the second surface of the light transmissive substrate, forming one or more through holes in the light transmissive substrate to correspond to the first and second electrodes, and forming first and second via electrodes by filling the through holes with a conductive material.

20 Claims, 16 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,039 B2 | 5/2012 | Jeong et al. |
| 8,179,938 B2 | 5/2012 | Kim |
| 8,183,592 B2 | 5/2012 | Lee et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,426,885 B2 | 4/2013 | Lee et al. |
| 8,432,511 B2 | 4/2013 | Jeong |
| 8,459,832 B2 | 6/2013 | Kim |
| 8,482,026 B2 | 7/2013 | Hoppel |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2011/0204399 A1 | 8/2011 | Lim et al. |
| 2012/0007120 A1 | 1/2012 | Kim et al. |
| 2012/0091481 A1 | 4/2012 | Sekine et al. |
| 2012/0305967 A1 | 12/2012 | Yeh |
| 2013/0099199 A1 | 4/2013 | Cha et al. |
| 2013/0313514 A1 | 11/2013 | Hwang et al. |
| 2013/0313583 A1 | 11/2013 | Hwang et al. |
| 2013/0341658 A1 | 12/2013 | Lee et al. |
| 2014/0203240 A1 | 7/2014 | Hwang et al. |

FOREIGN PATENT DOCUMENTS

| | | |
|---|---|---|
| KR | 10-2012-0029275 A | 3/2012 |
| KR | 10-2012-0029276 A | 3/2012 |
| KR | 10-2012-0052651 A | 5/2012 |
| KR | 10-2012-0055390 A | 5/2012 |
| KR | 10-2012-0055391 A | 5/2012 |
| KR | 10-2012-0058137 A | 6/2012 |
| KR | 10-2012-0065603 A | 6/2012 |
| KR | 10-2012-0065605 A | 6/2012 |
| KR | 10-2012-0065606 A | 6/2012 |
| KR | 10-2012-0065607 A | 6/2012 |
| KR | 10-2012-0065608 A | 6/2012 |
| KR | 10-2012-0065609 A | 6/2012 |
| KR | 10-2012-0065610 A | 6/2012 |
| KR | 10-2012-0067157 A | 6/2012 |
| KR | 10-2012-0079670 A | 7/2012 |
| KR | 10-2012-0079730 A | 7/2012 |
| KR | 10-2012-0084119 A | 7/2012 |
| KR | 10-2013-0022085 A | 3/2013 |
| KR | 10-2013-0040518 A | 4/2013 |
| KR | 10-2013-0044717 A | 5/2013 |
| KR | 10-1258583 B1 | 5/2013 |
| KR | 10-1309112 B1 | 9/2013 |
| KR | 10-2013-0107537 A | 10/2013 |
| KR | 10-2013-0130543 A | 12/2013 |
| KR | 10-2013-0131217 A | 12/2013 |
| KR | 10-2013-0139113 A | 12/2013 |
| KR | 10-2014-0000818 A | 1/2014 |
| KR | 10-2014-0093433 A | 7/2014 |

METHOD OF MANUFACTURING LIGHT EMITTING DIODE PACKAGE

CROSS-REFERENCE TO RELATED APPLICATION

This application claims the benefit of Korean Patent Application No. 10-2014-0020167 filed on Feb. 21, 2014, with the Korean Intellectual Property Office, the disclosure of which is incorporated herein by reference.

TECHNICAL FIELD

The present disclosure relates to a light emitting diode (LED) package and a method of manufacturing the LED package.

BACKGROUND

A light emitting diode (LED) is a device including a material that emits light using electric energy. The energy generated through an electron-hole recombination in semiconductor junction parts is converted into light that is to be emitted therefrom. LEDs are commonly used as light sources in illumination devices, display devices, and the like.

In particular, a recent increase in development and employment of gallium nitride-based LEDs, and the commercialization of mobile device keypads, turn signal lamps, camera flashes, and the like, using the gallium nitride-based LEDs, have led to an acceleration of the development of general lighting devices using the LEDs. The LEDs have been used for small portable products, and recently the LEDs are also used for large-sized products having a high output and a high efficiency, such as backlight units of large TVs, headlamps of vehicles, general lighting devices, and the like.

Accordingly, a method of reducing manufacturing costs for the mass production of LED packages is provided.

SUMMARY

An exemplary embodiment in the present disclosure may provide a novel method of manufacturing alight emitting diode (LED) package in order to reduce manufacturing costs.

According to an exemplary embodiment in the present disclosure, a method of manufacturing the light emitting diode (LED) package may include forming a light emitting structure having a first conductivity-type semiconductor layer, an active layer and a second conductivity-type semiconductor layer on a growth substrate, and forming first and second electrodes connected to the first and second conductivity-type semiconductor layers, respectively. The method also includes bonding a first surface of a light transmissive substrate opposite to a second surface thereof to the light emitting structure, identifying positions of the first and second electrodes that are seen through the second surface of the light transmissive substrate, forming one or more through holes in regions of the light transmissive substrate that correspond to the first and second electrodes, and forming first and second via electrodes by filling the through holes with a conductive material.

The light transmissive substrate may be formed of an insulating material.

The insulating material may include $SiO_2$.

The method may further include polishing the second surface of the light transmissive substrate through a chemical and mechanical polishing process after the bonding of the light transmissive substrate.

The bonding of the light transmissive substrate to the light emitting structure may be performed by applying a light transmissive adhesive to a surface of the light emitting structure and bonding the light transmissive substrate to the light transmissive adhesive.

The light transmissive adhesive may include water glass or silicone.

The light transmissive substrate may be bonded to the light emitting structure at a temperature of approximately 400° C. or below.

The bonding of the light transmissive substrate to the light emitting structure may be performed through anodic bonding.

The bonding of the light transmissive substrate to the light emitting structure may also be performed through fusion bonding.

The light transmissive substrate may be formed to have a thickness of approximately 10 μm to 500 μm.

The growth substrate may be formed of Si.

According to still another exemplary embodiment in the present disclosure, a method of manufacturing a light emitting diode (LED) package may include forming a light emitting structure including a first conductivity-type semiconductor layer, an active layer and a second conductivity-type semiconductor layer on the growth substrate, and forming first and second electrodes connected to the first and second conductivity-type semiconductor layers, respectively. The method also includes disposing a first alignment key on an upper surface of the light emitting structure, preparing a light transmissive substrate having a first surface and a second surface opposite to the first surface, forming first and second via electrodes penetrating through the first and second surfaces in regions of the light transmissive substrate that correspond to the first and second electrodes, disposing a second alignment key on at least one of the first and second surfaces, and bonding the first surface of the light transmissive substrate to the upper surface of the light emitting structure. The light transmissive substrate is arranged to allow the second alignment key on the light transmissive substrate to correspond to the first alignment key on the light emitting structure which is seen through the second surface of the light transmissive substrate.

The light transmissive substrate may be formed of an insulating material.

The insulating material may include $SiO_2$.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
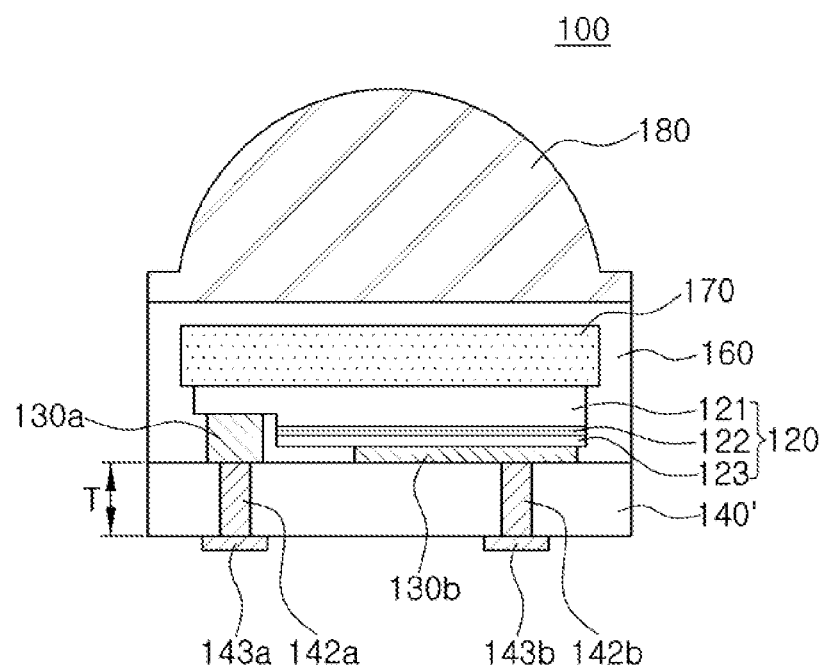
FIG. 1 is a cross-sectional view of a light emitting diode (LED) package according to an exemplary embodiment of the present disclosure.
Figure 2:
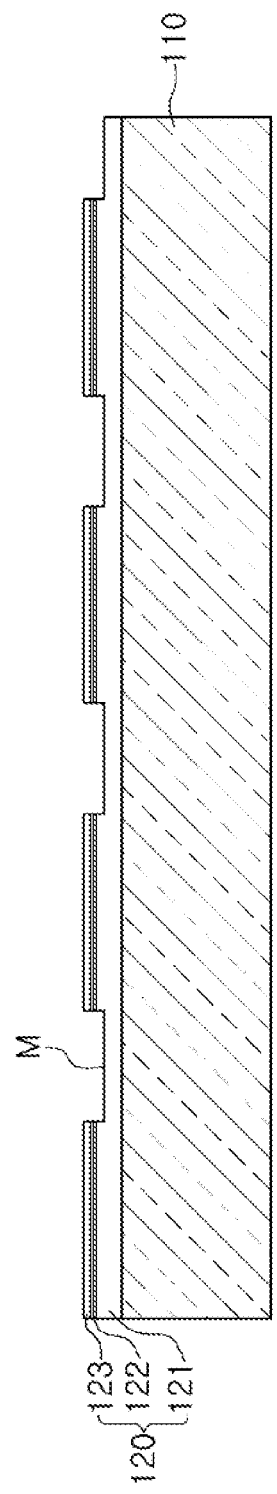
FIGS. 2 through 10 are views illustrating major processes in a method of manufacturing the LED package according to the exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

With reference to FIG. 1, a light emitting diode (LED) package 100 according to an exemplary embodiment of the present disclosure may include a mounting substrate 140' having first and second via electrodes 142a and 142b, a light emitting structure 120 mounted on the mounting substrate 140', a wavelength conversion layer 170 disposed on an upper surface of the light emitting structure 120, an encapsulation body 160 disposed to enclose the light emitting structure 120 and the wavelength conversion layer 170.

The first and second via electrodes 142a and 142b may be formed in the mounting substrate 140', and the light emitting structure 120 may be mounted on the first and second via electrodes 142a and 142b, such that first and second electrodes 130a and 130b of the light emitting structure 120 are electrically connected to the first and second via electrodes 142a and 142b.

Specifically, the first and second via electrodes 142a and 142b may be formed to penetrate through a first surface of the mounting substrate 140' on which the light emitting structure 120 is mounted and a second surface of the mounting substrate 140' opposite to the first surface. First and second bonding pads 143a and 143b may be formed on the second surface of the mounting substrate 140' to which ends of the first and second via electrodes 142a and 142b are exposed, so that both surfaces of the mounting substrate 140' are electrically connected to each other. The mounting substrate 140' may be a substrate used for manufacturing a package in a wafer state, which is a so-called wafer level package (WLP). Since both surfaces of the mounting substrate 140' are flat, the size of the package, in which the light emitting structure 120 is mounted on the mounting substrate 140', may be reduced to the size of the light emitting structure 120.

Here, the mounting substrate 140' may be formed of a light transmissive material. Specifically, the light transmissive material may be light transmissive resin or glass that may have insulating properties and may be resistant to heat. The light transmissive resin may include at least one of polymethylmethacrylate (PMMA) and polycarbonate (PC), and the glass may include $SiO_2$. Since such transparent glass has light transmission properties, an object disposed on one surface of the glass substrate may be identified from a direction of another surface of the glass substrate. Accordingly, when the mounting substrate 140' is formed of the light transmissive material, the positions of the via electrodes may be easily identified in a process of manufacturing an LED package. Details thereof will be provided in the manufacturing process to be described below.

The light emitting structure 120 may be mounted on the mounting substrate 140' and may include a first conductivity-type semiconductor layer 121, an active layer 122 and a second conductivity-type semiconductor layer 123 sequentially disposed from an upper portion of the light emitting structure 120. The first and second conductivity-type semiconductor layers 121 and 123 may be n-type and p-type semiconductor layers formed of nitride semiconductors, respectively. The present disclosure is not limited thereto. However, according to the present exemplary embodiment, the first and second conductivity type semiconductor layers 121 and 123 may be understood as referring to the n-type and the p-type semiconductor layers, respectively. The first and second conductivity type semiconductor layers 121 and 123 may be formed of a material having a composition of $Al_xIn_yGa_{(1-x-y)}N$, where $0 \le x < 1$, $0 \le y < 1$ and $0 \le x+y < 1$. For example, GaN, AlGaN, InGaN, or the like, may be used therefor.

The active layer 122 may be a layer for emitting visible light having a wavelength of approximately 350 nm to 680 nm. The active layer 122 may be formed of undoped nitride semiconductor layers having a single-quantum-well (SQW) structure or a multi-quantum-well (MQW) structure. For example, the active layer 122 may have the MQW structure in which quantum barrier layers and quantum well layers having a composition of $Al_xIn_yGa_{(1-x-y)}N$ (where $0 \le x < 1$, $0 \le y < 1$, and $0 \le x+y < 1$) are alternately stacked, such that the active layer 122 may have a predetermined energy bandgap and emit light through the recombination of electrons and holes in quantum wells. In the case of the MQW structure, an InGaN/GaN structure may be used, for example. The first and second conductivity type semiconductor layers 121 and 123 and the active layer 122 may be formed using crystal growth processes such as metal organic chemical vapor deposition (MOCVD), molecular beam epitaxy (MBE), hydride vapor phase epitaxy (HVPE), and the like.

The light emitting structure 120 may be used as an LED chip having a flip-chip structure after the removal of a growth substrate, and a buffer layer may be further included in order to reduce crystal defects during the growth of the semiconductor layers.

The first and second electrodes 130a and 130b are provided to allow the first and second conductivity-type semiconductor layers 121 and 123 to be electrically connected to a power source. The first and second electrodes 130a and 130b may be disposed to ohmic-contact the first and second conductivity type semiconductor layers 121 and 123, respectively.

The first and second electrodes 130a and 130b may be formed of a single layer or multilayer structure made of a conductive material having an ohmic contact with the respective first and second conductivity type semiconductor layers 121 and 123. For example, the first and second electrodes 130a and 130b may be formed by depositing or sputtering at least one of gold (Au), silver (Ag), copper (Cu), zinc (Zn), aluminum (Al), indium (In), titanium (Ti), silicon (Si), germanium (Ge), tin (Sn) magnesium (Mg), tantalum (Ta), chromium (Cr), tungsten (W), ruthenium (Ru), rhodium (Rh), iridium (Ir), nickel (Ni), palladium (Pd), platinum (Pt), and a transparent conductive oxide (TCO). The first and second electrodes 130a and 130b may be disposed on the surface of the mounting substrate 140' on which the light emitting structure 120 is mounted.

Figure 11:
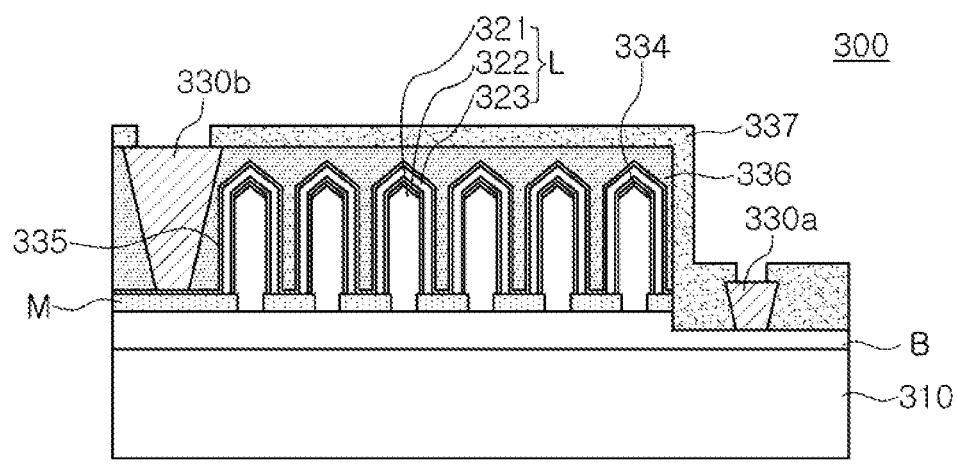
FIG. 11 is a side cross-sectional view of a light emitting structure applicable to the LED package according to the exemplary embodiment of the present disclosure.

Various types of LED chips may be employed in the present exemplary embodiment. FIG. 11 is a side cross-sectional view of an LED chip applicable to the LED package according to an exemplary embodiment of the present disclosure.

An LED chip 300 illustrated in FIG. 11 may include a substrate 310, a base layer B disposed on the substrate 310, and a plurality of light emitting nanostructures L disposed on the base layer B.

The substrate 310 may be an insulating substrate, a conductive substrate or a semiconductor substrate. For example, the substrate 310 may be formed of sapphire, SiC, Si, $MgAl_2O_4$, MgO, $LiAlO_2$, $LiGaO_2$, GaN or the like. The base layer B may be formed of a nitride semiconductor containing $Al_xIn_yGa_{1-x-y}N$ (where $0 \leq x < 1$, $0 \leq y < 1$, and $0 \leq x+y < 1$), and may be doped with an n-type impurity such as Si to be converted to have a particular conductivity-type.

An insulating layer M having a plurality of openings may be disposed on the base layer B for growth of the light emitting nanostructures L (especially, nanocores 321). Portions of the base layer B may be exposed through the openings, and the nanocores 321 may be formed on the exposed portions of the base layer B. That is, the insulating layer M may be used as a mask for growth of the nanocores 321. The insulating layer M may be formed of an insulating material such as $SiO_2$ or $SiN_x$ that may be used in a semiconductor growth process.

The light emitting nanostructures L may include the first conductivity-type semiconductor nanocore 321. The light emitting nanostructures L may also include an active layer 322 and a second conductivity-type semiconductor layer 323 sequentially disposed on the surface of the nanocore 321.

Similar to the base layer B, the nanocore 321 may be doped with the n-type impurity and be formed of the nitride semiconductor containing $Al_xIn_yGa_{1-x-y}N$ (where $0 \leq x < 1$, $0 \leq y < 1$, and $0 \leq x+y < 1$). For example, the nanocore 321 may be formed of n-type GaN. The active layer 322 may have the MQW structure in which quantum well layers and quantum barrier layers are alternately stacked. For example, in a case in which the active layer 322 is formed of the nitride semiconductor, a GaN/InGaN structure may be used therefor. Alternatively, the active layer 322 may have the SQW structure. The second conductivity-type semiconductor layer 323 may be a crystal doped with a p-type impurity and containing $Al_xIn_yGa_{1-x-y}N$ (where $0 \leq x < 1$, $0 \leq y < 1$, and $0 \leq x+y < 1$).

The LED chip 300 may include a contact electrode 335 in the ohmic contact with the second conductivity-type semiconductor layer 323. The contact electrode 335 used in the present exemplary embodiment may be formed of a transparent electrode material in order to allow light to be emitted in a direction toward the light emitting nanostructures L. For example, the contact electrode 335 may be formed of the transparent electrode material such as ITO. As necessary, graphene may be used therefor.

The contact electrode 335 is not limited thereto, and may include Ag, Ni, Al, Rh, Pd, Ir, Ru, Mg, Zn, Pt, Au or the like. In addition, the contact electrode 335 may have two or more layers formed of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. As necessary, a reflective electrode structure may be used to allow the LED chip 300 to have a flip-chip structure.

An insulating filler 336 may be formed in space between the light emitting nanostructures L. An insulating material such as $SiO_2$ or $SiN_x$ may be used for the insulating filler 336. Specifically, in order to facilitate the filling of the space between the light emitting nanostructures L, TEOS (TetraEthylOrthoSilane), BPSG (BoroPhospho Silicate Glass), CVD-$SiO_2$, SOG (Spin-on Glass), or SOD (Spin-on Delectric) may be used for the insulating filler 336. According to exemplary embodiments, the contact electrode 335 may be formed to fill all or some of the space between the light emitting nanostructures L.

In addition, the LED chip 300 may include first and second electrodes 330a and 330b. The first electrode 330a may be disposed on an exposed region of the base layer B, and the second electrode 330b may be disposed on an extended and exposed region of the contact electrode 335.

The LED chip 300 may further include a passivation layer 337. The passivation layer 337 may be used to protect the light emitting nanostructures L together with the insulating filler 336. The passivation layer 337 may cover and protect the entirety of the semiconductor region and may firmly fix the first and second electrodes 330a and 330b in place. The passivation layer 337 may be formed of a material identical or similar to the material of the insulating filler 336.

In the present exemplary embodiment, a tip portion of the nanocore 321 may have inclined crystal planes (e.g. planes) different from side crystal planes (e.g. m planes) of the nanocore 321. A current blocking intermediate layer 334 may be formed in the tip portion of the nanocore 321. The current blocking intermediate layer 334 may be disposed between the active layer 322 and the nanocore 321. The current blocking intermediate layer 334 may be formed of a material having high electrical resistance in order to block a leakage current that may be caused at the tip portion of the nanocore 321. For example, the current blocking intermediate layer 334 may be a semiconductor layer not doped intentionally, or may be a semiconductor layer doped with a second conductivity-type impurity different from that of the nanocore 321. For example, in a case in which the nanocore 321 is formed of n-type GaN, the current blocking intermediate layer 334 may be an undoped GaN layer or a GaN layer doped with a p-type impurity such as magnesium (Mg). Such a current blocking intermediate layer 334 may be a high resistance region formed of the same material (for example, GaN) but obtained with various doping concentrations or doping materials, without being particularly distinguished from an adjacent layer. For example, GaN may be grown, while an n-type impurity is supplied thereto, to form the nanocore 321. GaN may continue to be grown, while the supply of the n-type impurity is blocked or the p-type impurity such as magnesium (Mg) is supplied thereto, to form the desired current blocking intermediate layer 334. Alternatively, while GaN for the nanocore 321 is being grown, a source of aluminum (Al) and/or indium (In) may be additionally supplied to form the current blocking intermediate layer 334 having a different composition of $Al_xIn_yGa_{1-x-y}N$ (where $0 \leq x < 1$, $0 \leq y < 1$, and $0 \leq x+y < 1$).

Referring to FIG. 1, the wavelength conversion layer 170 may be disposed on the upper surface of the light emitting structure 120. The wavelength conversion layer 170 may be formed as a sheet having a substantially uniform thickness. The wavelength conversion layer 170 may be a film in which a B-stage material semi-cured at a room temperature and converted to a liquid phase when heated is dispersed together with a phosphor.

Specifically, the semi-cured material may be B-stage silicone. Here, the wavelength conversion layer 170 may be formed of a single layer or multiple layers. In a case in which the wavelength conversion layer 170 is formed of the multiple layers, different types of phosphor may be provided in respective layers. The wavelength conversion layer 170 may be formed by mixing the B-stage resin with the phosphor. For example, a polymer binder including a resin, a hardener, a hardening catalyst and the like is mixed with a phosphor to form a B-stage composite.

The phosphor may be used to convert a wavelength of light to a wavelength of yellow, red, or green light. Types of phosphor may be determined based on the wavelength of light emitted from the active layer 122 of the light emitting structure 120. Specifically, the phosphor may have the following compositions and colors:

Oxide-based phosphors: Yellow and Green $Y_3Al_5O_{12}$:Ce, $Tb_3Al_5O_{12}$:Ce, $Lu_3Al_5O_{12}$:Ce;

Silicate-based phosphors: Yellow and Green $(Ba,Sr)_2SiO_4$: Eu, Yellow and Orange $(Ba,Sr)_3SiO_5$:Ce;

Nitride-based phosphors: Green β-SiAlON:Eu, Yellow $La_3Si_6O_{11}$:Ce, Orange α-SiAlON:Eu, Red $CaAlSiN_3$:Eu, $Sr_2Si_5N_8$:Eu, $SrSiAl_4N_7$:Eu;

Fluoride-based phosphors: KSF-based Red $K_2SiF_6$:$Mn^{4+}$.

Phosphor compositions should basically conform to Stoichiometry, and respective elements may be substituted with different elements of respective groups of the periodic table. For example, strontium (Sr) may be substituted with barium (Ba), calcium (Ca), magnesium (Mg), or the like, of alkaline earths (II group). Yttrium (Y) may be substituted with terbium (Tb), lutetium (Lu), scandium (Sc), gadolinium (Gd), or the like, of lanthanoids. Also, europium (Eu), an activator, may be substituted with cerium (Ce), terbium (Tb), praseodymium (Pr), erbium (Er), ytterbium (Yb), or the like, according to a desired energy level. The activator may be used alone, or a subactivator, or the like, may be additionally used to change light emitting characteristics.

In addition, materials such as quantum dots (QDs), or the like, may be used as materials in place of phosphors. Phosphors and quantum dots may be used in combination.

A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell. The quantum dot may create various colors according to sizes.

Table 1 below shows types of phosphor in application fields of white light emitting devices using blue LEDs (wavelength: 440 nm to 460 nm).

TABLE 1

| Purpose | Phosphors |
|---|---|
| LED TV BLU | β-SiAlON:$Eu^{2+}$ |
| | (Ca, Sr)AlSiN$_3$:$Eu^{2+}$ |
| | La$_3$Si$_6$O$_{11}$:$Ce^{3+}$ |
| | K$_2$SiF$_6$:$Mn^{4+}$ |
| Lighting | Lu$_3$Al$_5$O$_{12}$:$Ce^{3+}$ |
| Devices | Ca-α-SiAlON:$Eu^{2+}$ |
| | La$_3$Si$_6$N$_{11}$:$Ce^{3+}$ |
| | (Ca, Sr)AlSiN$_3$:$Eu^{2+}$ |
| | Y$_3$Al$_5$O$_{12}$:$Ce^{3+}$ |
| | K$_2$SiF$_6$:$Mn^{4+}$ |
| Side Viewing | Lu$_3$Al$_5$O$_{12}$:$Ce^{3+}$ |
| (Mobile, | Ca-α-SiAlON:$Eu^{2+}$ |
| Notebook PC) | La$_3$Si$_6$N$_{11}$:$Ce^{3+}$ |
| | (Ca, Sr)AlSiN$_3$:$Eu^{2+}$ |
| | Y$_3$Al$_5$O$_{12}$:$Ce^{3+}$ |
| | (Sr, Ba, Ca, Mg)$_2$SiO$_4$:$Eu^{2+}$ |
| | K$_2$SiF$_6$:$Mn^{4+}$ |
| Electrical | Lu$_3$Al$_5$O$_{12}$:$Ce^{3+}$ |
| Components | Ca-α-SiAlON:$Eu^{2+}$ |
| (Vehicle | La$_3$Si$_6$N$_{11}$:$Ce^{3+}$ |
| Head Lamp, | (Ca, Sr)AlSiN$_3$:$Eu^{2+}$ |
| etc.) | Y$_3$Al$_5$O$_{12}$:$Ce^{3+}$ |
| | K$_2$SiF$_6$:$Mn^{4+}$ |

The resin used in the wavelength conversion layer 170 may be a resin having high adhesive properties, high light transmittance, high resistance to heat and moisture, high photorefraction, and the like. Epoxy resin or silicone resin which is an inorganic polymer may be used therefor. In order to secure high adhesive properties, a silane material or the like may be used as an additive for improving adhesive strength.

By using such a wavelength conversion layer 170, the LED package 100 emitting white light may be provided. The LED package 100 may include active layers that emit light having different wavelengths, so that the LED package 100 can emit white light without using the phosphor. For example, in the LED package 100 having the light emitting nanostructures L (see FIG. 11), the active layers that emit light having different wavelengths under the same growth conditions may be formed by changing the sizes of nanocores and/or distances between the nanocores, whereby desired white light may be produced.

The encapsulation body 160 may be disposed to enclose the light emitting structure 120 and the wavelength conversion layer 170. Accordingly, the encapsulation body 160 may protect the light emitting structure 120 and the wavelength conversion layer 170 from moisture and heat, and the distribution of light emitted from the light emitting structure 120 may be adjusted by changing a shape of a surface of the encapsulation body 160.

The encapsulation body 160 may be formed of a light transmissive material. Specifically, the encapsulation body 160 may be formed of an insulating resin having light transmissive properties such as a composition selected among a silicon resin, a modified silicon resin, an epoxy resin, a urethane resin, an oxetane resin, an acrylic resin, a polycarbonate resin, a polyimide resin, and a combination thereof. However, the material of the encapsulation body 160 is not limited thereto, and an inorganic material having high light resistance such as glass, silica gel or the like may be used.

A lens unit 180 may be further formed on the encapsulation body 160. A shape of the lens unit 180 may be adjusted to control the distribution of light emitted from the light emitting structure 120. The lens unit 180 may be formed of a light transmissive material, like the encapsulation body 160. Specifically, the lens unit 180 may be formed of the insulating resin having the light transmissive properties such as the composition selected among the silicon resin, the modified silicon resin, the epoxy resin, the urethane resin, the oxetane resin, the acrylic resin, the polycarbonate resin, the polyimide resin, and the combination thereof. However, the material of the lens unit 180 is not limited thereto, and the inorganic material having the high light resistance such as glass, silica gel or the like may be used.

With reference to FIGS. 2 through 10, a method of manufacturing the LED package according to the exemplary embodiment of the present disclosure will be described below.

First of all, the light emitting structure 120 including the first conductivity-type semiconductor layer 121, the active layer 122 and the second conductivity-type semiconductor layer 123 may be formed on a growth substrate 110.

The growth substrate 110 may be provided as a semiconductor growth substrate, and may be formed of an insulating material, a conductive material or a semiconductor material, such as sapphire, SiC, Si, $MgAl_2O_4$, MgO, $LiAlO_2$, $LiGaO_2$, GaN or the like. In a case of the growth substrate 110 formed of sapphire, a crystal having Hexa-Rhombo R3C symmetry, a sapphire substrate has a lattice constant of 13.001 Å along a C-axis and a lattice constant of 4.758 Å along an A-axis, and includes aC (0001) plane, anA (11-20) plane, an R (1-102) plane, and the like. Here, the C plane is mainly used as a substrate for nitride semiconductor growth because the C plane facilitates growth of a nitride film and is stable at high temperatures. Meanwhile, in a case in which the growth substrate 110 is formed of Si, a Si substrate may be easily formed to have a large diameter and may be relatively cheap, whereby manufacturing yields may be improved. Although not shown, prior to the forming of the light emitting structure 120, a buffer layer may be further formed on one surface of the growth substrate 110 on which the first conductivity-type semiconductor layer 121 is to be formed.

The light emitting structure 120 may be formed by sequentially stacking the first conductivity-type semiconductor layer 121, the active layer 122 and the second conductivity-type semiconductor layer 123.

The first and second conductivity-type semiconductor layers 121 and 123 may be formed of a nitride semiconductor material having a composition expressed by $Al_xIn_yGa_{(1-x-y)}N$, (where $0 \leq x < 1$, $0 \leq y < 1$, and $0 \leq x+y < 1$), and doped with n-type and p-type impurities, respectively, of which GaN, AlGaN, and InGaN are representative semiconductor materials. In addition, Si, Ge, Se, Te, C or the like may be used as the n-type impurities, and Mg, Zn, Be or the like may be used as the p-type impurities. The first and second conductivity-type semiconductor layers 121 and 123 may be formed by using a semiconductor growth method such as metal organic chemical vapor deposition (MOCVD), molecular beam epitaxy (MBE), hydride vapor phase epitaxy (HVPE), or the like. Specifically, according to the present exemplary embodiment, the first and second conductivity-type semiconductor layers 121 and 123 may be formed by growing GaN on the above-described Si growth substrate 110.

A mesa-etched surface M may be formed in a region of the light emitting structure 120. The region of the first conductivity-type semiconductor layer 121 exposed through a mesa-etching process may be used as a device separation region. The mesa-etched surface M may be formed by an appropriate etching process such as inductive coupled plasma reactive ion etching (ICP-RIE).

Figure 3:
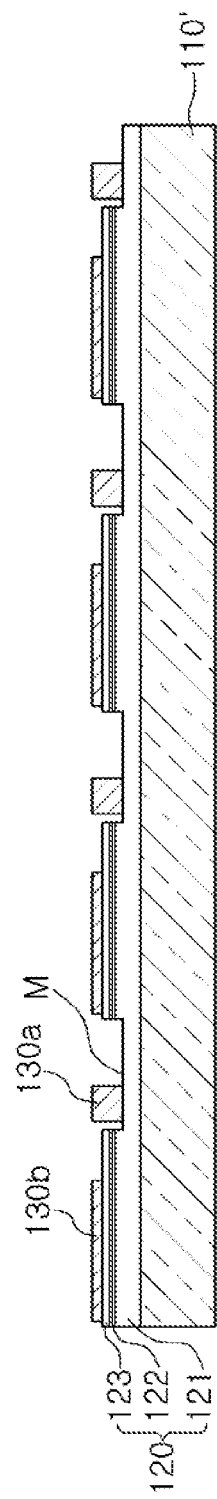
Figure 4:
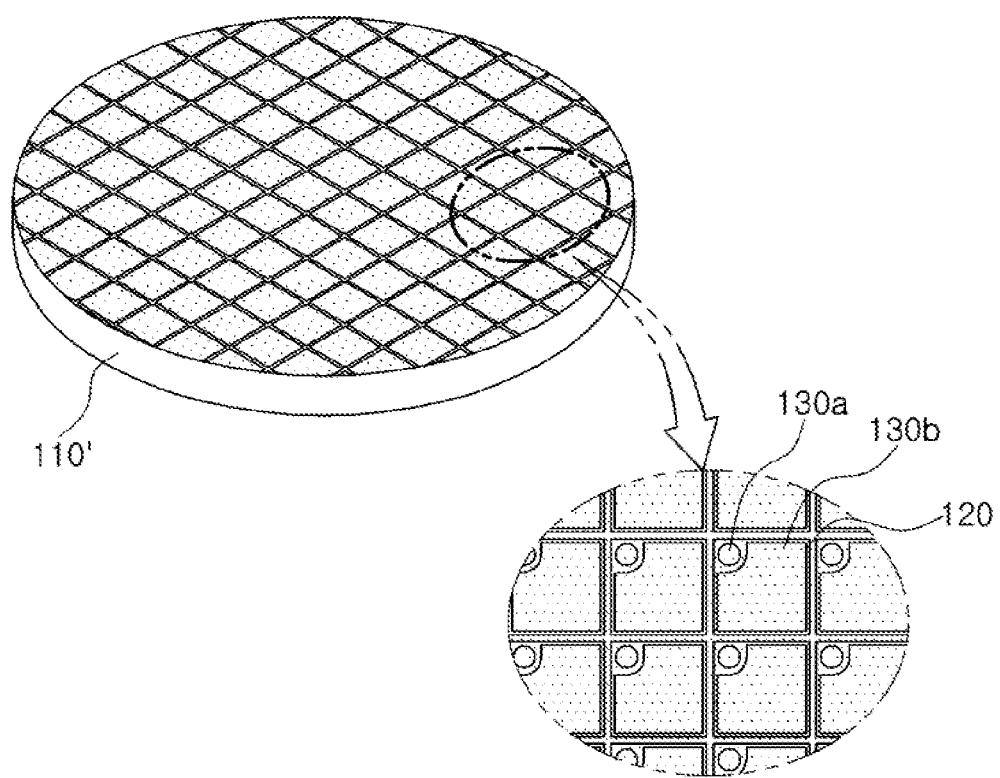

Next, as illustrated in FIGS. 3 and 4, the first and second electrodes 130a and 130b may be formed on the first and second conductivity-type semiconductor layers 121 and 123, respectively. The first and second electrodes 130a and 130b may include Ag, Ni, Al, Rh, Pd, Ir, Ru, Mg, Zn, Pt, Au or the like, and may have two or more layer structure formed of Ni/Ag, Zn/Ag, Ni/Al, Zn/Al, Pd/Ag, Pd/Al, Ir/Ag. Ir/Au, Pt/Ag, Pt/Al, Ni/Ag/Pt or the like. This manufacturing process may be performed on a wafer scale as illustrated in FIG. 4. The first and second electrodes 130a and 130b may have different shapes and may be spaced apart from each other, and the shapes and arrangements thereof are not limited to those illustrated in FIG. 4.

In addition, the other surface of the growth substrate 110 opposite to one surface thereof on which the light emitting structure 120 is grown may be processed through micromachining using a chemical mechanical polishing (CMP) method, thereby forming a thin growth substrate 110'. Here, the CMP method is performed for planarization of a surface of an object through a combination of chemical and mechanical actions. However, the present disclosure is not limited thereto. Thus, a portion of the other surface of the growth substrate 110 may be chemically etched, or the process of making the growth substrate 110 thin may be omitted if the growth substrate is sufficiently thin.

Meanwhile, an oxide film may be formed on the light emitting structure 120 to cover the first and second electrodes 130a and 130b, and a surface of the oxide film may be flattened such that bonding of a light transmissive substrate 140 may be further facilitated in a follow-up process.

Figure 5:
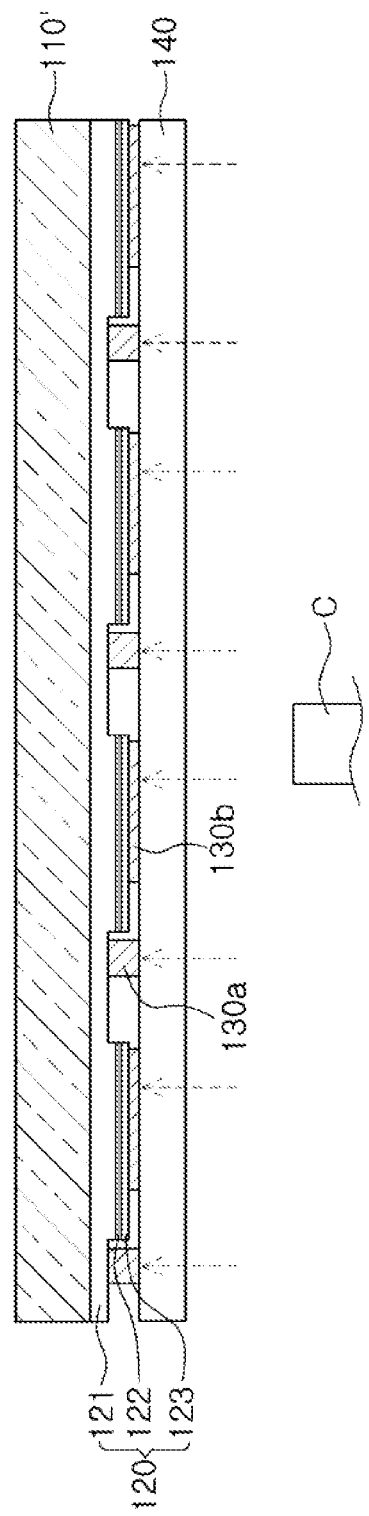
Figure 6:
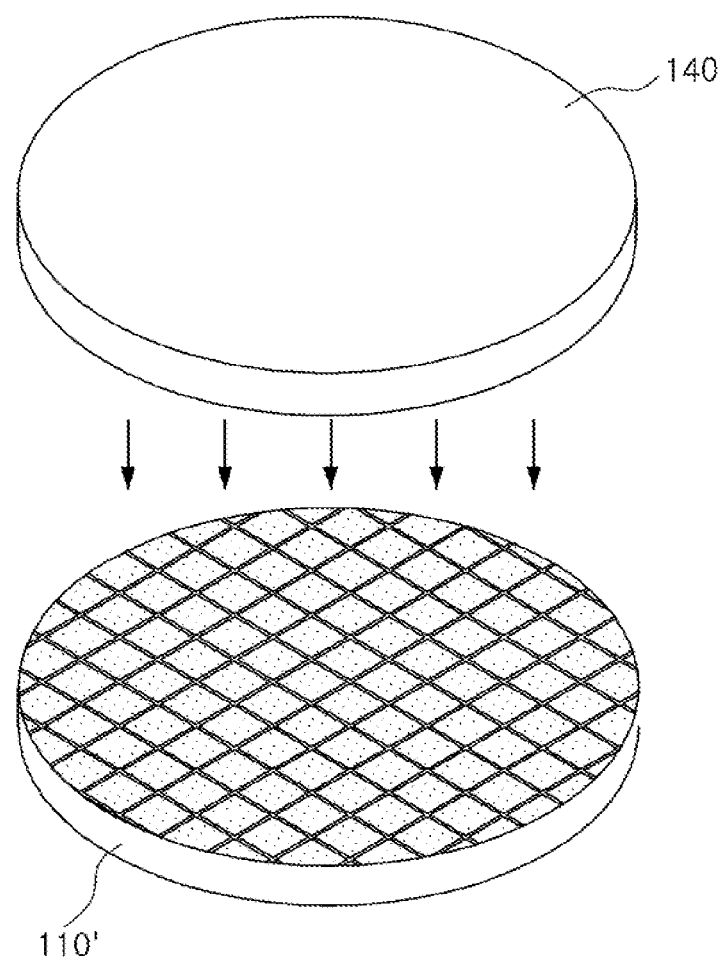

Thereafter, as illustrated in FIGS. 5 and 6, the light transmissive substrate 140 may be bonded to the light emitting structure 120. The light transmissive substrate 140 may have a first surface and a second surface opposite to the first surface. As illustrated in FIG. 6, the light transmissive substrate 140 may be provided as a wafer. As described above, the light transmissive substrate 140 may be formed of an insulating material, and light transmissive resin or glass may be used therefor. Here, the light transmissive resin may include at least one of polymethylmethacrylate (PMMA) and polycarbonate (PC), and the glass may include $SiO_2$. In addition, the light transmissive substrate 140 may have a thickness of approximately 10 μm to 500 μm.

The light transmissive substrate 140 may be bonded to the light emitting structure 120 by applying a light transmissive adhesive such as water glass or silicone to an upper surface of the light emitting structure 120 and heating the same at a temperature of approximately 400° C. or below. In addition, the light transmissive substrate 140 and the light emitting structure 120 may be bonded to each other through anodic bonding or fusion bonding at a temperature of approximately 400° C. or below. In a case in which the light transmissive substrate 140 is bonded to the light emitting structure 120 at a relatively low temperature of approximately 400° C. or below, damage to the light emitting structure 120 from the heat may be reduced as compared with a case in which the bonding process is performed at a relatively high temperature. In particular, in the case of the LED package to which light emitting nanostructures L as illustrated in FIG. 11 are applied, it is necessary to precisely adjust the concentration of indium (In) in order to obtain active layers that emit light having different wavelengths. In the case in which the light transmissive substrate 140 is bonded to the light emitting nanostructures L at a relatively high temperature, indium (In) contained within the active layers may be dispersed due to the heat, resulting in a change in concentration of indium (In) within the active layers. Such a change in concentration of indium (In) within the active layers may cause a change in wavelength of light emitted from the LED package, resulting in deterioration of reliability of the LED package. Therefore, when the light transmissive substrate 140 is bonded at the relatively low temperature as in the present exemplary embodiment, such a change in the wavelength of the light emitted from the LED package may be prevented.

Due to the light transmissive properties of the light transmissive substrate 140, a contact surface between the light transmissive substrate 140 and the light emitting structure 120 may be seen through the transparent light transmissive substrate, and the positions of the first and second electrodes 130a and 130b of the light emitting structure 120 may be easily identified. Therefore, it is easy to determine the positions of the via electrodes 142a and 142b to be connected to the first and second electrodes 130a and 130b in a follow-up process.

The positions of the first and second electrodes 130a and 130b of the light emitting structure 120 may be identified using an optical instrument C of a general exposure system. In general, since a Si substrate or the like used as the mounting substrate 140' is opaque, the positions of the electrodes of the light emitting structure 120 are not identified using such an optical instrument C of a general exposure system. In this case, a relatively expensive instrument such as an infrared camera is generally used to identify the positions of the first and second electrodes 130a and 130b. According to the exemplary embodiment of the present disclosure, such an existing opaque substrate is replaced with the transparent, light transmissive substrate, and thus the positions of the electrodes may be easily identified using the optical instrument C of a general exposure system. Accordingly, manufacturing costs and time of the LED package may be reduced.

Meanwhile, the other surface of the light transmissive substrate 140 opposite to one surface thereof in contact with the light emitting structure 120 may be processed through micromachining using a chemical mechanical polishing (CMP) method, thereby allowing the light transmissive substrate 140 to have a reduced thickness. However, the present disclosure is not limited thereto. Thus, a portion of the other surface of the light transmissive substrate 140 may be chemically etched, or the process of making the light transmissive substrate 140 thin may be omitted if the light transmissive substrate 140 is sufficiently thin.

Figure 7:
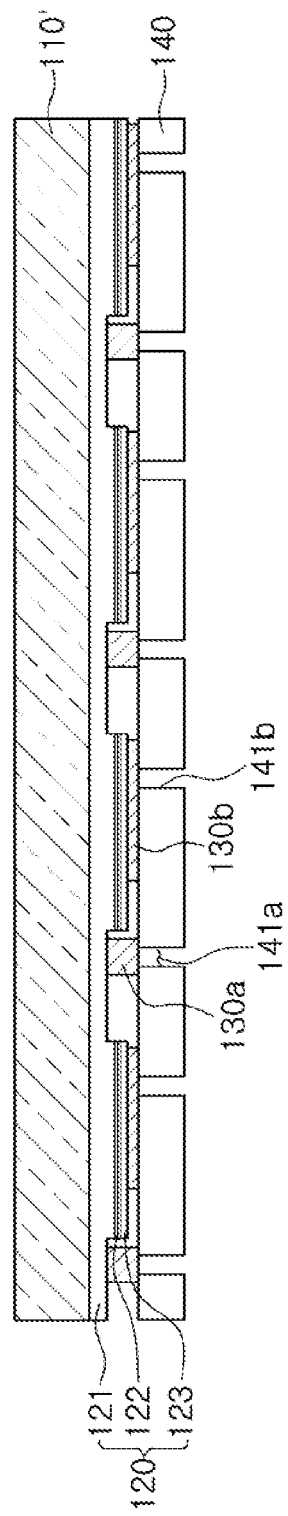

Next, as illustrated in FIG. 7, first and second through holes 141a and 141b may be formed in the light transmissive substrate 140. The first and second through holes 141a and 141b may be formed in regions corresponding to the first and second electrodes 130a and 130b of the light emitting structure 120.

The first and second through holes 141a and 141b may be provided as at least one pair of holes in a first direction perpendicular to one surface of the light transmissive substrate 140 which is in contact with the light emitting structure 120. The first and second through holes 141a and 141b may be provided as tube-like space penetrating through the light transmissive substrate 140 in the first direction. The spaces may have various shapes such as a cylindrical shape, a polyprism shape, or the like. In the present exemplary embodiment, the space may be formed to have a cylindrical shape.

The first and second through holes 141a and 141b may be formed by dry-etching the light transmissive substrate 140 through oxide-deep reactive ion etching (oxide-DRIE) or the like. However, this process is not limited thereto, and various types of dry or wet etching may be used. Alternatively, the first and second through holes 141a and 141b may be formed by laser-drilling.

Figure 8:
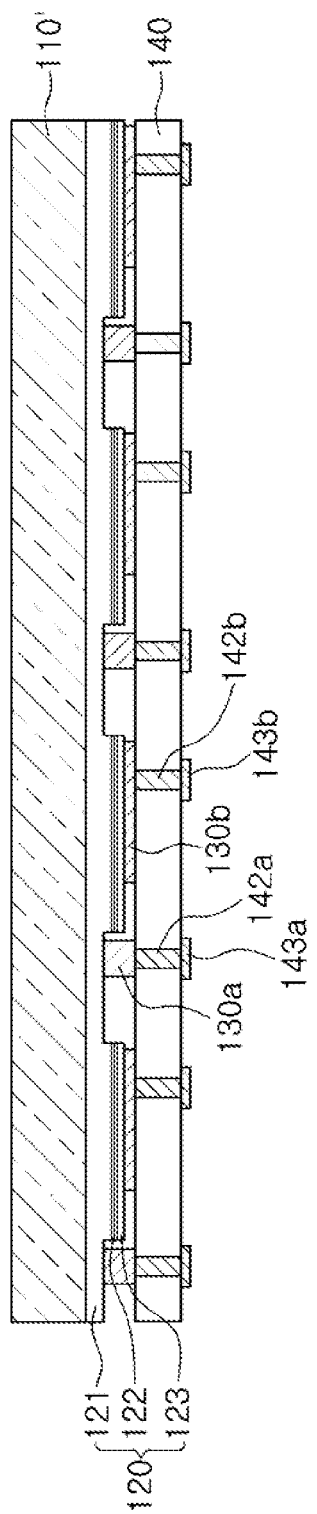

Then, as illustrated in FIG. 8, the first and second through holes 141a and 141b may be filled with a conductive material such as a metal or the like, thereby forming the first and second via electrodes 142a and 142b.

The first and second via electrodes 142a and 142b may be formed by preparing a paste using a conductive material including Ag, Ni, Al, Rh, Pd, Ir, Ru, Mg, Zn, Pt, Au or the like and filling the first and second through holes 141a and 141b with the paste, or may be formed through plating.

In the present exemplary embodiment, since the first and second via electrodes 142a and 142b may be formed in the light transmissive substrate 140 that is formed of an insulating material such as glass, it is not necessary to form an oxide film on inner surfaces of the via electrodes for electrical insulation, unlike a substrate formed of a semiconductor material such as Si. Therefore, the process of forming the via electrodes may be simplified.

Figure 9:
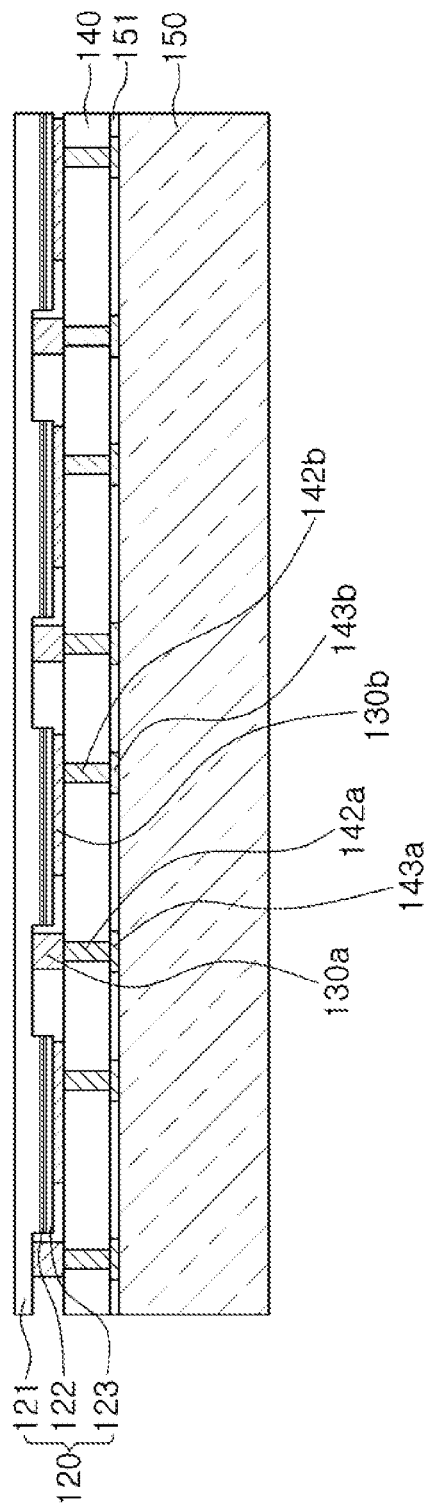

Thereafter, as illustrated in FIG. 9, a support substrate 150 may be bonded to the bottom of the light transmissive substrate 140, and the thin growth substrate 110' may be removed. In a case in which the light transmissive substrate 140 is used as the growth substrate, the thin growth substrate may not be removed. An adhesive 151 may be further applied to the bottom of the light transmissive substrate 140. The support substrate 150 is a support body for preventing damage to the light emitting structure 120 in a follow-up process, and various types of substrate may be used therefor. In the present exemplary embodiment, a Si substrate may be used.

Figure 10:
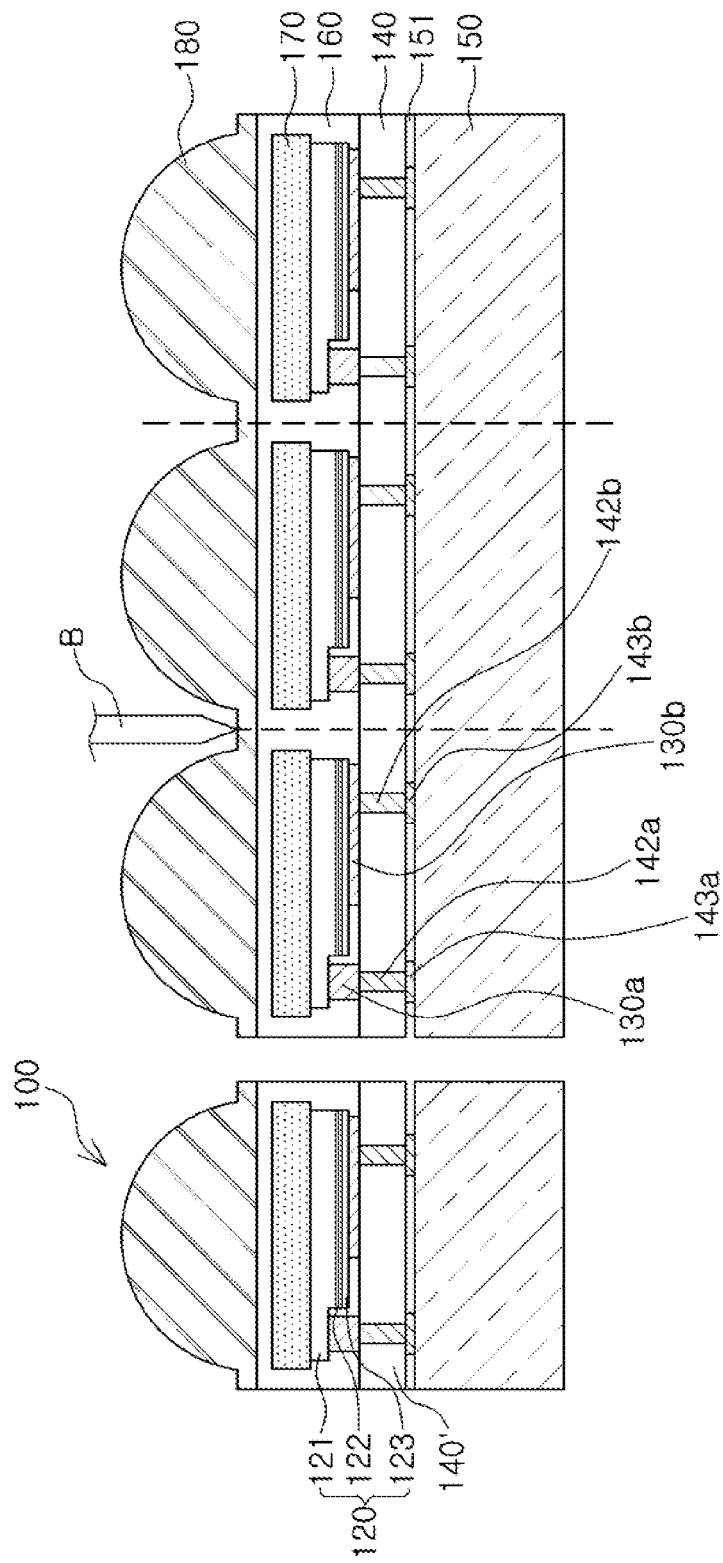

Then, as illustrated in FIG. 10, the wavelength conversion layer 170 may be disposed on the light emitting structure 120, and the encapsulation body 160 may be formed to enclose the light emitting structure 120 and the wavelength conversion layer 170. In addition, the lens unit 180 may be bonded to the top of the encapsulation body 160. A breaking process for separating individual LED packages 100 may be performed using a blade B. Finally, the LED package 100 of FIG. 1 may be manufactured.

Figure 12:
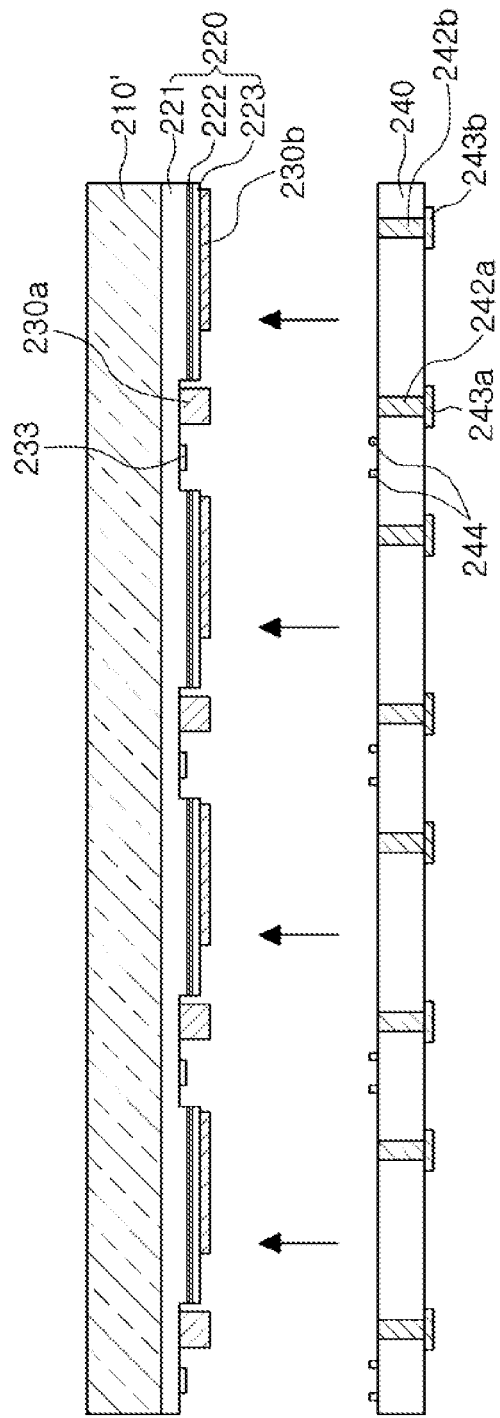
FIGS. 12 and 13 are views illustrating major processes in a method of manufacturing the LED package according to another exemplary embodiment of the present disclosure.
Figure 13:
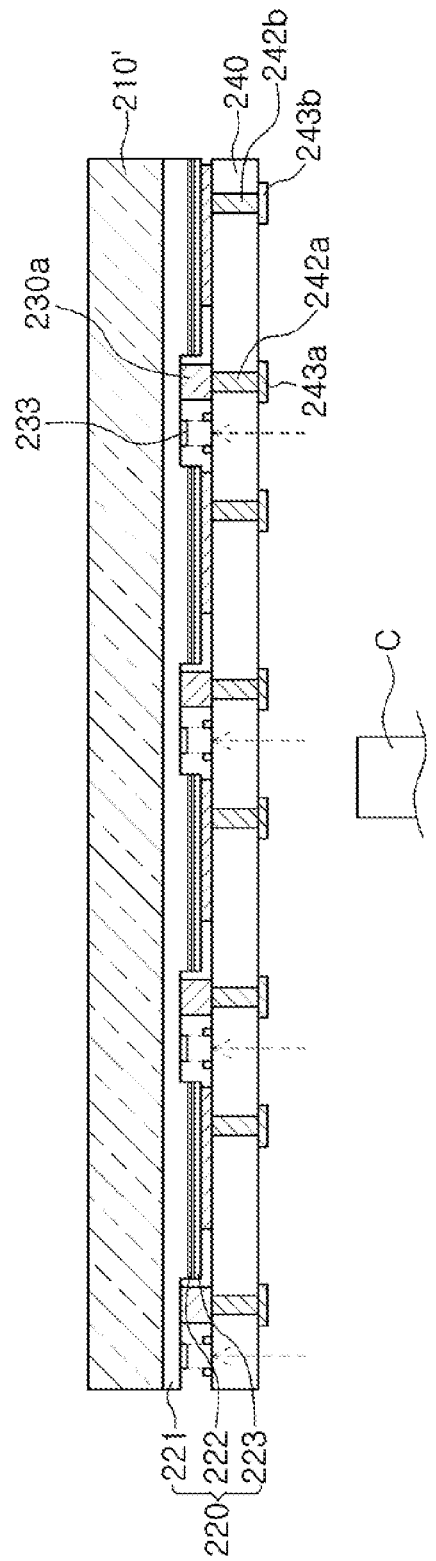

Hereinafter, a method of manufacturing an LED package according to another exemplary embodiment of the present disclosure will be described. FIGS. 12 and 13 are views illustrating major processes in a method of manufacturing the LED package according to another exemplary embodiment of the present disclosure.

The manufacturing method according to the present exemplary embodiment is different from that the method according to the previous exemplary embodiment. In the method shown in FIGS. 12 and 13, a light transmissive substrate 240 may be bonded to a light emitting structure 220 after via electrodes are formed in the light transmissive substrate 240. Since details of the other processes are identical to those described in the previous exemplary embodiment, different processes will mainly be described hereinafter.

As illustrated in FIG. 12, the light emitting structure 220 is similar to the light emitting structure 120 of FIG. 3, except that a first alignment key 233 is formed on an exposed surface of the light emitting structure 220. In addition, first and second via electrodes 242a and 242b and bonding pads 243a and 243b may be formed in a light transmissive substrate 240 before the light transmissive substrate 240 is bonded to the light emitting structure 220. Furthermore, a second alignment key 244 may be formed to correspond to the first alignment key 233 on a surface of the light transmissive substrate 240 which is bonded to the light emitting structure 220.

As illustrated in FIG. 13, the light emitting structure 220 and the light transmissive substrate 240 may be bonded to each other after the first alignment key 233 and the second alignment key 244 are arranged using an optical instrument C of a general exposure system. In general, a Si substrate or the like used as the mounting substrate is opaque, causing difficulties in identifying the positions of the alignment keys disposed on the mounting substrate and the light emitting structure using such the optical instrument C of the general exposure system. Therefore, the positions of the mounting substrate and the light emitting structure have been determined by capturing images of the alignment keys disposed on the mounting substrate and the light emitting structure, and analyzing the positions of the alignment keys prior to the bonding thereof. This process has required an expensive imaging device capable of capturing the images of the alignment keys disposed on the mounting substrate and the light emitting structure at the same time. In the present exemplary embodiment, such an existing opaque substrate is replaced with the transparent, light transmissive substrate, and thus the first alignment key 233 disposed on the light emitting structure 220 which is seen through the transparent, light transmissive substrate 240 and the second alignment key 244 disposed on the light transmissive substrate 240 may be easily arranged using the optical instrument C of the general exposure system. Accordingly, manufacturing costs and time of the LED package may be reduced.

The LED package according to the above-described exemplary embodiments may be advantageously applied to various products.

Figure 14:
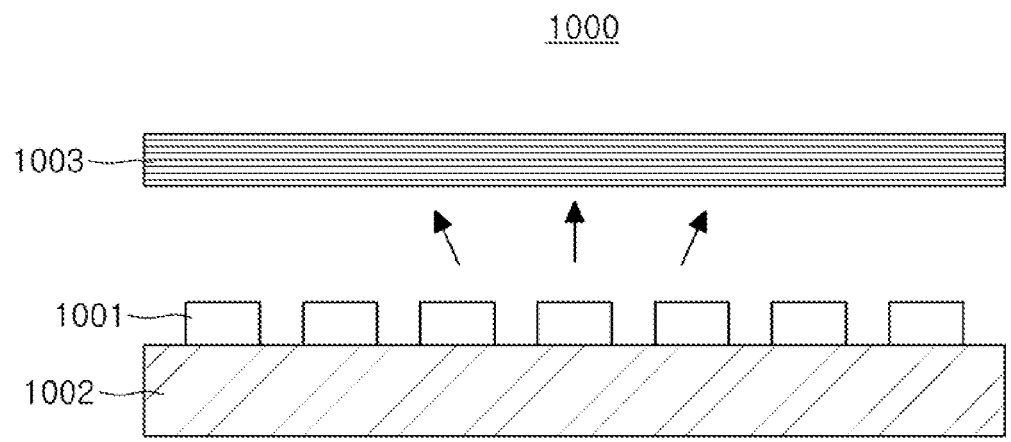
FIGS. 14 and 15 illustrate examples of a backlight unit to which the LED package according to the exemplary embodiment of the present disclosure is applied.
Figure 15:
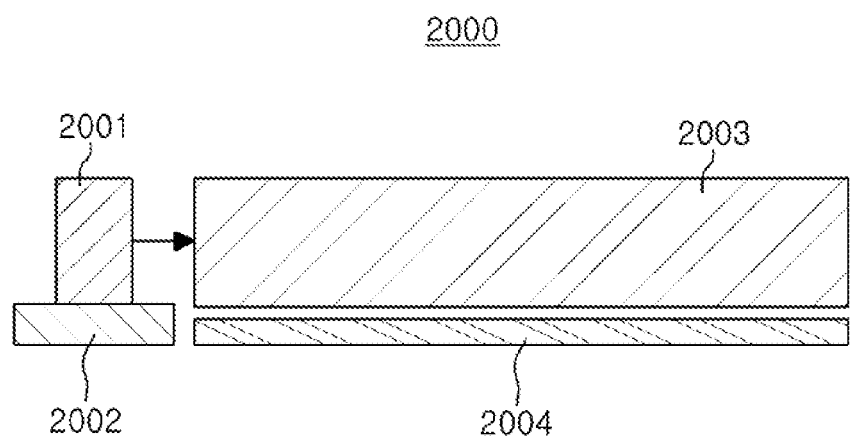

FIGS. 14 and 15 illustrate examples of a backlight unit to which the LED package according to the exemplary embodiment of the present disclosure is applied.

Referring to FIG. 14, the backlight unit 1000 includes at least one light source 1001 mounted on a substrate 1002 and at least one optical sheet 1003 disposed above the light source 1001. The aforementioned semiconductor light emitting device or the aforementioned package having the semiconductor light emitting device may be used as the light source 1001. The light source 1001 in the backlight unit 1000 of FIG. 14 emits light toward a liquid crystal display (LCD) device disposed thereabove.

A light source 2001 mounted on a substrate 2002 in a backlight unit 2000 as another example illustrated in FIG. 15 emits light laterally, and the light is incident to a light guide plate 2003 such that the backlight unit 2000 may serve as a surface light source. The light travelling to the light guide plate 2003 may be emitted upwardly, and a reflective layer 2004 may be disposed below a lower surface of the light guide plate 2003 in order to improve a light extraction efficiency.

Figure 16:
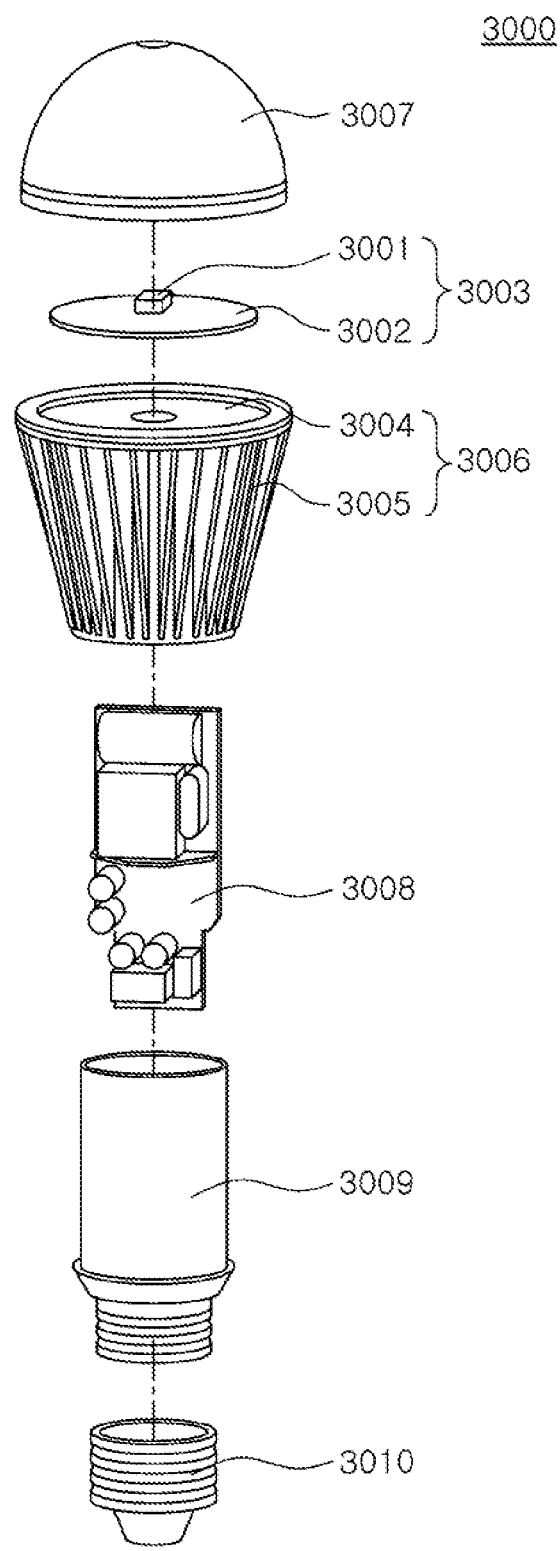
FIG. 16 illustrates an example of a lighting device to which the LED package according to the exemplary embodiment of the present disclosure is applied.

FIG. 16 is an exploded perspective view illustrating an example of a lighting device to which the semiconductor light emitting device according to the exemplary embodiment of the present disclosure is applied.

A lighting device 3000 is illustrated, for example, as a bulb-type lamp in FIG. 16, and includes a light emitting module 3003, a driver 3008, and an external connector 3010.

In addition, the lighting device 3000 may further include exterior structures such as external and internal housings 3006 and 3009, a cover 3007, and the like. The light emitting module 3003 may include a light source 3001 having the aforementioned semiconductor light emitting device package structure or a structure similar thereto, and a circuit board 3002 on which the light source 3001 is mounted. For example, first and second electrodes of the semiconductor light emitting device may be electrically connected to an electrode pattern of the circuit board 3002. In the present exemplary embodiment, a single light source 3001 is mounted on the circuit board 3002. However, a plurality of light sources may be mounted thereon as necessary.

The external housing 3006 may serve as a heat radiator. The external housing 3006 may include a heat sink plate 3004 directly contacting the light emitting module 3003 to thereby improve heat dissipation, and heat radiating fins 3005 surrounding a lateral surface of the lighting device 3000. The cover 3007 may be disposed above the light emitting module 3003 and may have a convex lens shape. The driver 3008 may be disposed inside the internal housing 3009 and be connected to the external connector 3010 such as a socket structure to receive power from an external power source. In addition, the driver 3008 may convert the received power into power appropriate for driving the light source 3001 of the light emitting module 3003 and supply the converted power thereto. For example, the driver 3008 may be configured as an AC-DC converter, a rectifying circuit part, or the like.

Figure 17:
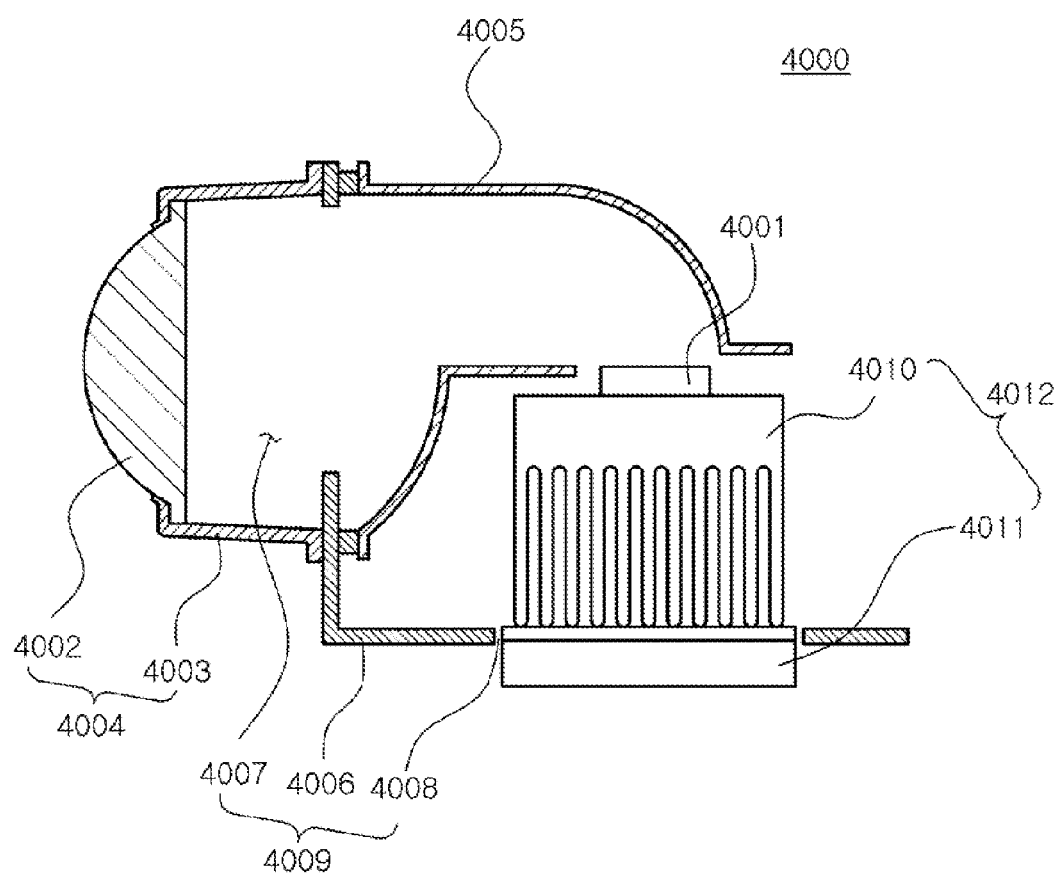
FIG. 17 illustrates an example of a headlamp to which the LED package according to the exemplary embodiment of the present disclosure is applied.

FIG. 17 illustrates an example of a headlamp to which the semiconductor light emitting device according to the exemplary embodiment of the present disclosure is applied.

With reference to FIG. 17, a headlamp 4000 used in a vehicle or the like may include a light source 4001, a reflector 4005 and a lens cover 4004. The lens cover 4004 may include a hollow guide part 4003 and a lens 4002. The light source 4001 may include the aforementioned semiconductor light emitting device or the aforementioned package having the same.

The headlamp 4000 may further include a heat radiator 4012 externally dissipating heat generated in the light source 4001. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supporting them. The housing 4009 may include a body 4006 and a central hole 4008 formed in one surface thereof, to which the heat radiator 4012 is coupled.

The housing 4009 may include a forwardly open hole 4007 formed in another surface thereof integrally connected to one surface thereof and bent in a direction perpendicular thereto. The reflector 4005 may be fixed to the housing 4009, such that light generated in the light source 4001 may be reflected by the reflector 4005, pass through the forwardly open hole 4007, and be emitted outwardly.

As set forth above, in the method of manufacturing the LED package according to exemplary embodiments of the present disclosure, the light transmissive substrate is used to effectively simplify the arrangement of electrodes, whereby manufacturing costs of the LED package may be reduced.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a light emitting diode (LED) package, comprising:
    providing a light transmissive substrate;
    forming a light emitting structure including a first conductivity-type semiconductor layer, an active layer and a second conductivity-type semiconductor layer;
    forming a first electrode connected to the first conductivity-type semiconductor layer;
    forming a second electrode connected to the second conductivity-type semiconductor layer;
    mounting the light emitting structure on the light transmissive substrate by bonding a first surface of the light transmissive substrate to the light emitting structure;
    identifying positions of the first and second electrodes through a second surface of the light transmissive substrate, the second surface of the light transmissive substrate being an opposite surface of the first surface of the light transmissive substrate;
    forming a plurality of through holes in the light transmissive substrate, the plurality of through holes including a first through hole corresponding to the first electrode and a second through hole corresponding to the second electrode;
    forming a first via electrode by filling the first through hole with a conductive material; and
    forming a second via electrode by filling the second through hole with the conductive material.

2. The method of claim 1, wherein the light transmissive substrate is formed of an insulating material.

3. The method of claim 2, wherein the insulating material includes $SiO_2$.

4. The method of claim 1, further comprising polishing the second surface of the light transmissive substrate through a chemical and mechanical polishing process after bonding the first surface of the light transmissive substrate to the light emitting structure.

5. The method of claim 1, wherein bonding the first surface of the light transmissive substrate to the light emitting structure is performed by applying a light transmissive adhesive to a first surface of the light emitting structure and bonding the first surface of the light transmissive substrate to the light transmissive adhesive.

6. The method of claim 5, wherein the light transmissive adhesive includes water glass or silicone.

7. The method of claim 1, wherein the light transmissive substrate is bonded to the light emitting structure at a temperature of approximately 400° C. or below.

8. The method of claim 1, wherein bonding the first surface of the light transmissive substrate to the light emitting structure is performed through anodic bonding.

9. The method of claim 1, wherein bonding the first surface of the light transmissive substrate to the light emitting structure is performed through fusion bonding.

10. The method of claim 1, wherein the light transmissive substrate is formed to have a thickness of approximately 10 μm to 500 μm.

11. The method of claim 1, wherein the light emitting structure is formed of GaN.

12. The method of claim 1, further comprising forming a wavelength conversion layer on a second surface of the light emitting structure.

13. The method of claim 12, further comprising forming an encapsulation body to enclose the light emitting structure and the wavelength conversion layer.

14. A method of manufacturing a light emitting diode (LED) package, comprising:
   providing a light transmissive substrate;
   forming a light emitting structure including a first conductivity-type semiconductor layer, an active layer and a second conductivity-type semiconductor layer on a growth substrate;
   forming a first electrode connected to the first conductivity-type semiconductor layer;
   forming a second electrode connected to the second conductivity-type semiconductor layer;
   disposing a first alignment key on a first surface of the light emitting structure;
   forming a first via electrode and a second via electrode by penetrating through the light transmissive substrate, the first via electrode corresponding to the first electrode, the second via electrode corresponding to the second electrode;
   disposing a second alignment key on a first surface of the light transmissive substrate; and
   mounting the light emitting structure on the light transmissive substrate by bonding the first surface of the light transmissive substrate to the first surface of the light emitting structure,
   wherein the light transmissive substrate is arranged to allow the second alignment key to correspond to the first alignment key, and
   the light emitting structure is seen through a second surface of the light transmissive substrate, the second surface of the light transmissive substrate being opposite to the first surface of the light transmissive substrate.

15. The method of claim 14, further comprising removing the growth substrate.

16. The method of claim 14, further comprising determining positions of the light transmissive substrate and the light emitting structure by capturing images of the first alignment key and the second alignment key.

17. The method of claim 14, wherein the light transmissive substrate is transparent.

18. The method of claim 14, wherein the forming the light emitting structure on the growth substrate includes sequentially stacking the first conductivity-type semiconductor layer, the active layer and the second conductivity-type semiconductor layer.

19. A method of forming a light emitting diode (LED) package, comprising:
   providing a transparent light transmissive substrate having a first surface and a second surface, the first surface of the light transmissive substrate being opposite to the second surface of the light transmissive substrate;
   forming a light emitting structure having a first surface and a second surface, the first surface of the light emitting structure being opposite to the second surface of the light emitting structure;
   aligning a position of the light emitting structure relative to a position of the light transmissive substrate by identifying the light emitting structure seen through the light transmissive substrate; and
   mounting the light emitting structure on the light transmissive substrate by bonding the first surface of the light transmissive substrate to the first surface of the light emitting structure.

20. The method of claim 19, further comprising forming one or more electrodes connected to the light emitting structure, and forming one or more electrodes corresponding the one or more electrodes.

* * * * *